(12) United States Patent
Sabotta et al.

(10) Patent No.: US 7,007,184 B2
(45) Date of Patent: Feb. 28, 2006

(54) DIMM CONNECTOR ACCOMODATING SIDEBAND SIGNALS FOR BATTERY STATUS AND/OR CONTROL

(75) Inventors: Michael L. Sabotta, Cypress, TX (US); M. Scott Bunker, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 909 days.

(21) Appl. No.: 09/948,890

(22) Filed: Sep. 7, 2001

(65) Prior Publication Data

US 2002/0058444 A1 May 16, 2002

Related U.S. Application Data

(60) Provisional application No. 60/231,384, filed on Sep. 8, 2000.

(51) Int. Cl.
*H01M 10/46* (2006.01)

(52) U.S. Cl. .................................... 713/340

(58) Field of Classification Search ................. 713/340
See application file for complete search history.

(56) References Cited

U.S. PATENT DOCUMENTS

| 4,595,880 | A | * | 6/1986 | Patil ............................ 324/427 |
| 4,737,771 | A | * | 4/1988 | Coash ....................... 340/539.1 |
| 5,315,228 | A | * | 5/1994 | Hess et al. ................... 320/106 |
| 5,528,460 | A | | 6/1996 | Byrd |
| 5,726,859 | A | | 3/1998 | Khadem et al. |
| 5,883,497 | A | * | 3/1999 | Turnbull ...................... 320/132 |
| 5,962,159 | A | | 10/1999 | Satou et al. |
| 6,098,140 | A | | 8/2000 | Pecone et al. |
| 6,160,718 | A | * | 12/2000 | Vakilian ...................... 361/803 |
| 6,243,315 | B1 | * | 6/2001 | Goodman .................... 365/222 |
| 6,252,511 | B1 | * | 6/2001 | Mondshine et al. ...... 340/636.1 |
| 6,307,377 | B1 | * | 10/2001 | Cummings et al. ......... 324/427 |
| 6,469,474 | B1 | * | 10/2002 | Bunker ........................ 320/132 |
| 6,492,058 | B1 | | 12/2002 | Watanabe et al. |
| 6,608,564 | B1 | * | 8/2003 | Post et al. ................ 340/693.5 |
| 6,747,878 | B1 | * | 6/2004 | Hipp et al. .................. 361/801 |
| 6,757,748 | B1 | * | 6/2004 | Hipp ............................ 710/2 |
| 6,871,300 | B1 | * | 3/2005 | Irving ......................... 714/47 |
| 2002/0056018 | A1 | | 5/2002 | Schumacher et al. |
| 2002/0059492 | A1 | | 5/2002 | Sabotta et al. |
| 2002/0080541 | A1 | | 6/2002 | Bunker et al. |
| 2003/0081387 | A1 | * | 5/2003 | Schulz ........................ 361/728 |

* cited by examiner

*Primary Examiner*—John R. Cottingham

(57) ABSTRACT

A DIMM connector, including pins for transmitting side band signals for at least one of battery status or control for a battery backed cache is disclosed.

10 Claims, 11 Drawing Sheets

FIG. 4F     FIG. 4G

DIMM CONNECTOR ACCOMODATING SIDEBAND SIGNALS FOR BATTERY STATUS AND/OR CONTROL

CLAIM TO EARLIER EFFECTIVE FILLING DATE

We hereby claim the earlier effective filing date of U.S. Provisional Application No. 60/231,384 filed Sep. 8, 2000.

IDENTIFICATION OF RELATED APPLICATIONS

This application also is related to, and shares common disclosure with, the following applications:
  Application Ser. No. 09/948,872 entitled "Method and Apparatus Implementing a Tuned Stub SCSI Topology," naming Matthew J. Schumacher and M. Scott Bunker as inventors, filed herewith;
  Application Ser. No. 09/948,892 entitled "Removable Battery Pack for a Cache Card," naming M. Scott Bunker, Michael L. Sabotta, and John R. Grady as inventors, filed herewith;
  Application Ser. No. 09/948,891 entitled "Method and Apparatus for Adapting a Card for Use with Multiple Protocols," naming M. Scott Bunker and Michael L. Sabotta as inventors, filed herewith; and
  Application Ser. No. 09/948,888 entitled "Battery Gauge Using a Resettable Decrementer in a DIMM," naming M. Scott Bunker as inventors, filed herewith.

BACKGROUND OF THE INVENTION

1. Field of the Invention

The present invention pertains to dual inline memory modules ("DIMMs") and, more particularly, to a DIMM connector accommodating sideband signals.

2. Description of the Related Art

As the power of individual electronic computing devices has increased, computing systems have become more distributed. Early "personal" computers, although powerful for their time, were suitable for little more than primitive word processing, spreadsheet, and video game applications. More intensive applications, e.g., computer aided design/computer aided manufacturing ("CAD/CAM") applications were typically hosted on relatively large, more powerful "mainframe" computers. Users invoked applications from time-sharing terminals that served as a conduit for information. However, most of the computational power resided on the host mainframe, where most of the computations were performed.

Stand-alone computing devices eventually evolved from dumb terminals and weak personal computers to powerful personal computers and workstations. As they became more powerful, the computational hours for applications became more distributed. Individual computers eventually became networked, and the networks distributed the computational activities among the network members. Many computations once performed on a mainframe computer, or that were not previously performed, were now performed on networked personal computers. Networks also permitted users to share certain types of computing resources, such as printers and storage.

More powerful computing devices also permitted larger, more complex networks and other computing systems. Small local area networks ("LANs") became wide area networks ("WANs"). Recently, networks have evolved to produce system or storage area networks ("SANs"). Some of these networks are public, e.g., the Internet. Some may be characterized as "enterprise computing systems" because, although very large, they restrict access to members of a single enterprise or other people they may authorize. Some enterprise computing systems are referred to as "intranets" because they employ the same communication protocols as the Internet.

FIG. 1 illustrates some concepts associated with large scale computing systems such as SANs. The computing system 100 includes two servers 105, 110 that include a Redundant Array of Independent Disks ("RAID") controller 115, a Fibre Host Bus Adapter ("HBA") 120, and at least one internal disk 125. Each RAID controller is connected to the internal disk 125 and an external storage enclosure 130, also commonly referred to as Just a Bunch Of Disks ("JBOD"). The RAID controller 115, internal disk 125, and JBOD 130 constitute "direct attached storage" subsystem. The direct attached storage subsystem is "local" to the respective servers 105, 110 in the sense that other servers cannot read from or write to it. The Fibre HBA 120 connected to a switch or hub 135 in a switched Fibre fabric 140. The servers 150, 110 can both read from and write to the mass storage units 145 through their respective Fibre HBA 120 and the switch/hub 135 in the switched fabric 140. Thus, the Fibre HBAs 120, switched fabric 140, switch/hub 135, and mass storage units 145 constitute a "shared" memory subsystem.

Most types of electronic and computing systems comprise many different devices that electronically communicate with each other over one or more buses. Exemplary types of devices include, but are not limited to, processors (e.g., microprocessors, digital signal processors, and micro-controllers), memory devices (e.g., hard disk drives, floppy disk drives, and optical disk drives), and peripheral devices (e.g., keyboards, monitors, mice). When electrically connected to a bus, these types of devices, as well as others not listed, are all sometimes generically referred to as "bus devices." In FIG. 1, the RAID controllers 115 communicate the buses 150, 155, respectively. The Fibre HBA 120 communicates with switched Fabric 140 and mass storage units 145 over buses 160, 165, respectively.

For instance, a computer typically includes one or more printed circuit boards having multiple integrated circuit components (or "bus devices") and connectors mounted to them. The components and connectors are interconnected by and communicate with each other over trace etched into the board. The boards are interconnected by plugging one or more of the boards into another board intended for this purpose. A first component on a board communicates with a second component on the same board over the traces etched onto the board. The first component communicates with a component on another board through the connectors by which the two boards are plugged into the third board intended for that purpose. Thus, both the traces on the boards and the connectors between the boards are a part of the bus. Again referring to FIG. 1, the RAID controllers 115 and Fibre HBAs 120 are two such printed circuit boards.

DIMMs are one common type of memory component. A DIMM is simply a printed circuit board ("PCB") on which a number of memory chips are mounted. The memory chips are usually some form of "volatile" memory, which means that the data stored in them will be lost if power supplied to the chips is interrupted. Many DIMMs therefore include battery packs mounted to them. The battery packs house batteries that provide "backup" power to the DIMM if the primary source of power is interrupted for some reason. The backup power supplied by the battery packs then provides an opportunity to save the data if primary power is restored in time.

DIMMs are widely used in mass storage devices such as redundant arrays of inexpensive disks ("RAIDs"). DIMMs are sometimes used in a RAID controller to implement a type of memory known as "cache," and DIMMs used in this context are therefore sometimes referred to as "cache cards." RAID controllers will only allow posted writes to occur when it can guarantee that the batteries can sustain backup for a minimum period of time agreed upon by the user in the event of a power outage.

Still another problem arises from the pin-out on connectors. Using a custom cache card limits the users options for upgrading and replacement of the memory module. By adding battery packs to a standard DIMM module allows the user to use a larger standard DIMM modules if more read ahead caching is required or use the battery backed DIMM if posted write data is required. The majority of the pins defined for DIMM connectors are required for normal operation. Side band signals used for battery status and control need to be shared with low priority DIMM signals or use special signals defined as no-connect. Typically, the industry has used custom non-industry standard cache card outlines and connectors, industry standard cache card without batteries, or industry standard cache card with batteries on main board. Alternatively, the industry has embedded the cache card on the main RAID controller. Each of these approaches has its disadvantages.

The present invention is directed to resolving, or at least reducing, one or all of the problems mentioned above.

SUMMARY OF THE INVENTION

In one aspect, the invention is a DIMM connector, including pins for at least one of battery status or control for transmitting side band signals for a battery backed cache.

BRIEF DESCRIPTION OF THE DRAWINGS

The invention may be understood by reference to the following description taken in conjunction with the accompanying drawings, in which like reference numerals identify like elements, and in which:

FIGS. 4D–4H illustrate the removable battery packs of the memory module of FIGS. 4A–4C;

Figure 1:
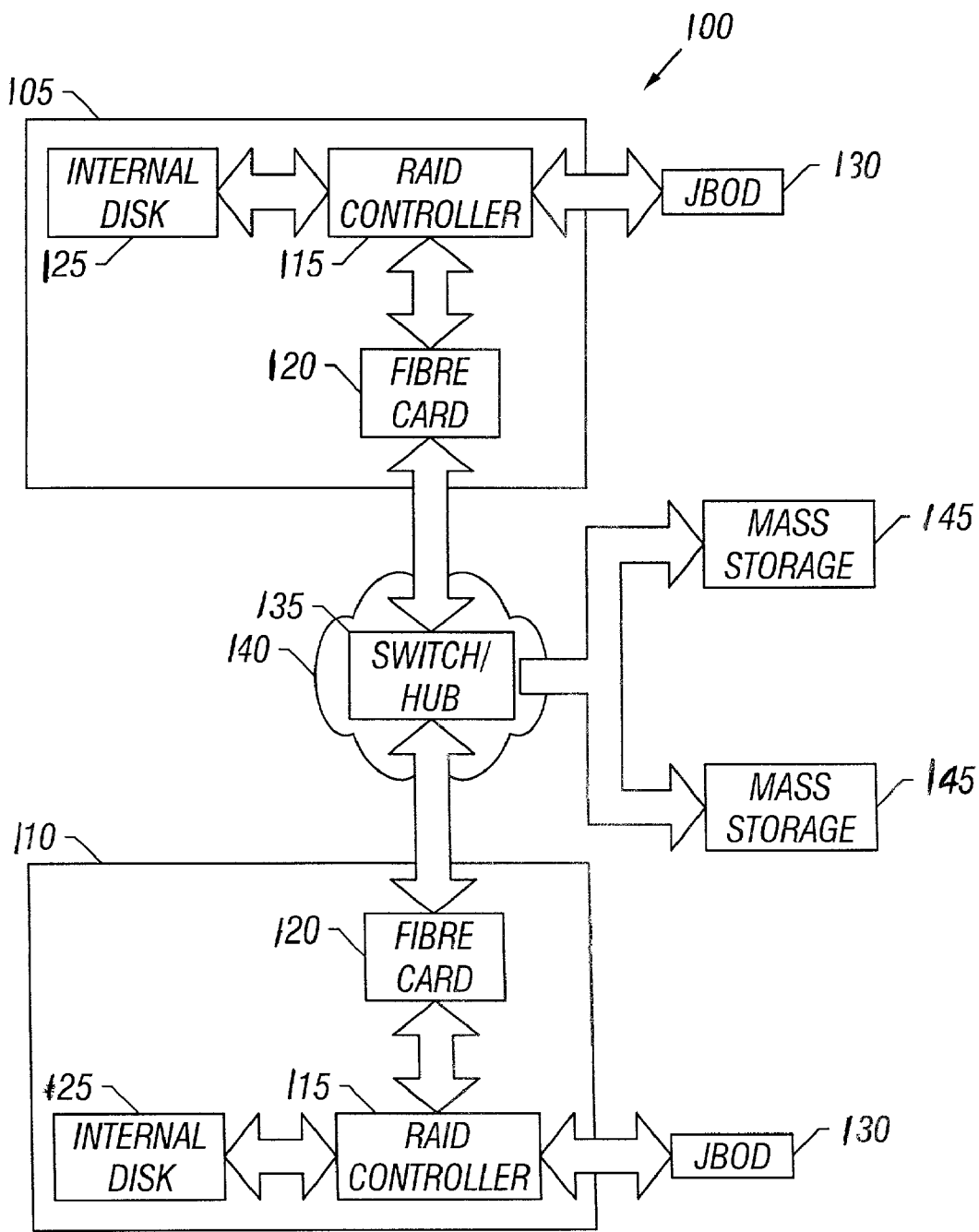
FIG. 1 illustrates several concepts associated with a prior art computing system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2A:
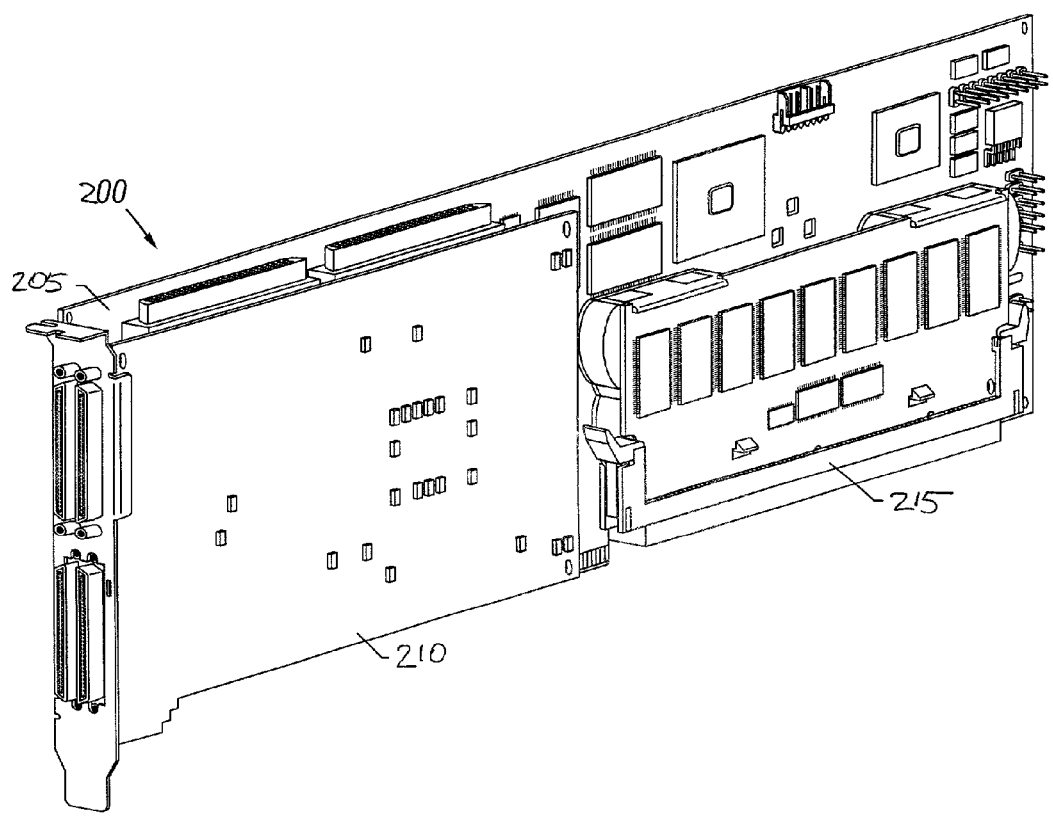
FIGS. 2A, 2B are an assembled and an exploded perspective view, respectively, of one particular embodiment of an intelligent host bus adapter implementing one particular version of the present invention.
Figure 2B:
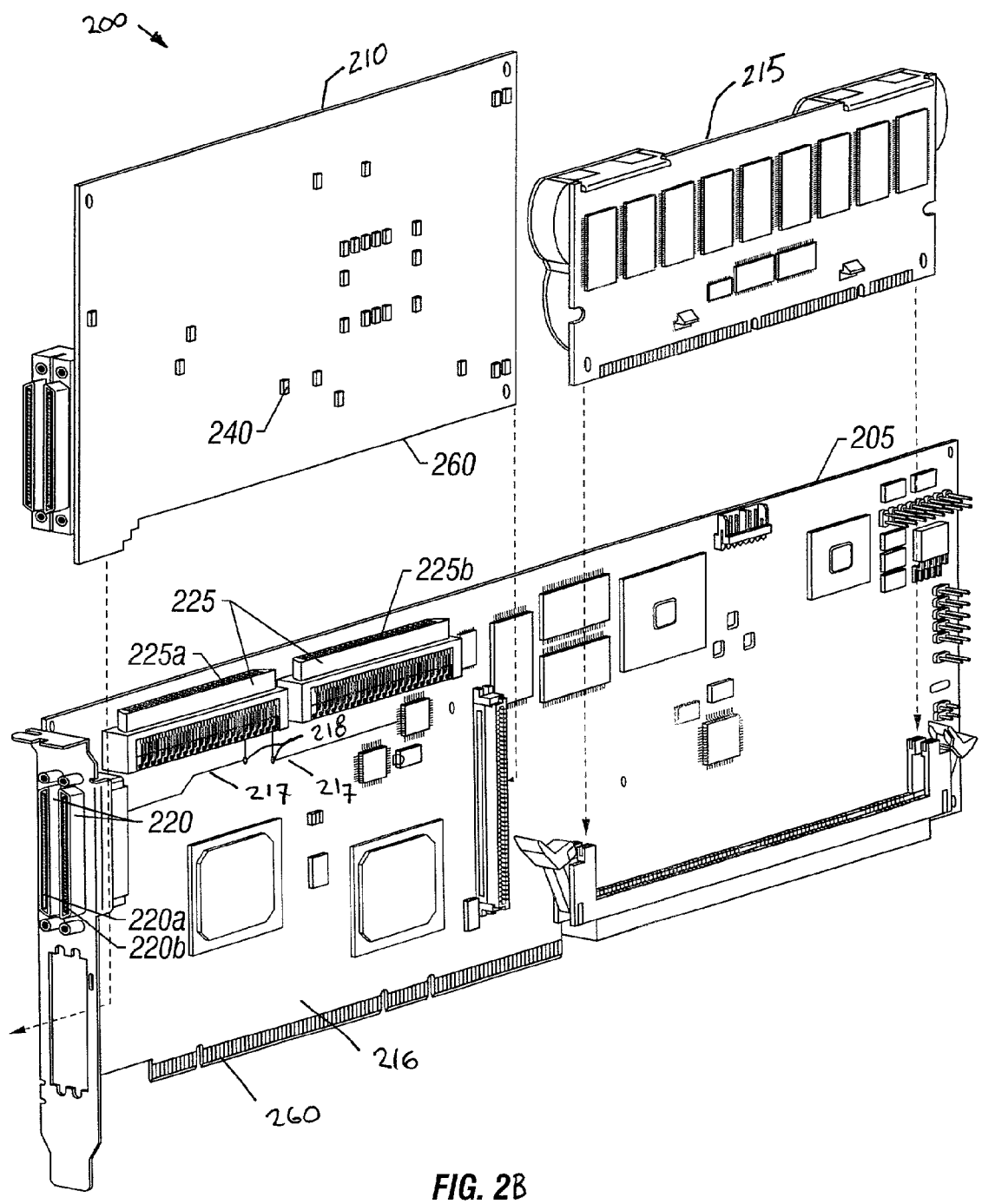

Turning now to the drawings, FIGS. 2A, 2B are an assembled and an exploded perspective view, respectively, of one particular embodiment of an Intelligent Host Bus Adapter ("HBA") 200 implementing one particular version of the present invention. The Intelligent HBA 200 is but one application for the tuned stub SCSI topology disclosed and claimed herein, and the invention is not so limited. The present invention may be employed in any part of a computing device or computing system that may employ a SCSI protocol. The Intelligent HBA 200 comprises, in the illustrated embodiment, three cards: a base adapter 205, a daughtercard 210, and a cache card 215. The cache card 215 in the illustrated embodiment is a DIMM module, but other embodiments may employ alternative technologies, e.g., a single in-line memory module ("SIMM"). The base adapter 205, the daughtercard 210, and the cache card 215 are shown in greater detail in FIG. 2B, FIG. 3A and FIG. 3B, and FIGS. 4A, 4C, respectively.

Figure 5:
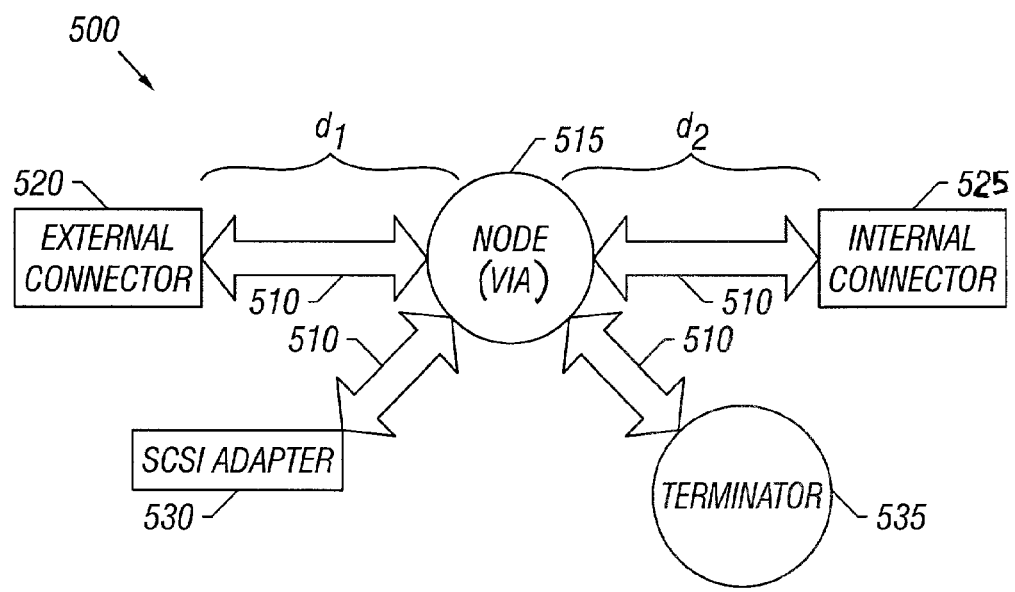
FIG. 5 conceptually illustrates a tuned stub, SCSI topology employed in the intelligent host bus adapter of FIG. 1.

Referring now to FIG. 2B, the base adapter 205 includes one particular implementation of the invention, i.e., the tuned stub, SCSI topology 500 conceptually illustrated in FIG. 5. In the embodiment illustrated in FIG. 2B, the topology includes a plurality of traces 217 in a printed circuit board ("PCB") 216 (only one of which is shown for the sake of clarity), a plurality of vias 218 in the PCB 216, an external connector 220, an internal connector 225, a SCSI adapter 230, and a plurality of terminator packages 235. The external connector 220 includes two ports 220a, 220b and the internal connector 225 includes two ports 225a, 225b. An ASIC 240 used to implement the RAID control features in accordance with conventional practice is mounted to the PCB 216.

The Intelligent HBA 200 is intended to be mounted in a server (not shown in FIGS. 2A, 2B). To this end, the base adapter 205 in the illustrated embodiment also includes an edge connector 260, which is 64-bit, peripheral component interconnect ("PCI") connector by which the Intelligent HBA 200 can be mounted into a slot in the server in conventional fashion. The Intelligent HBA 200 can then be connected to a RAID (not shown) through the external connector 220 and a suitable cable (not shown) and to a CPU (not shown) in the server through the internal connector 225. Thus, the external connector 220 is, by way of example and illustration, but one means for connecting the SCSI bus to an external computing device. Similarly, the internal connector 225 is, by way of example and illustration, but one means for connecting the SCSI bus to an internal component of the computing device in which the base adapter 205 is mounted.

Note that not all the features of the base adapter 205 are shown for the sake of clarity. As those in the art having the benefit of this disclosure will appreciate, such a base adapter 205 will include a number of implementation specific details not germane to the present invention. Such details, because they are routine and well known in the art, have been omitted from the drawing and the discussion herein in order not to obscure the invention.

As mentioned, FIG. 5 conceptually illustrates a tuned stub, SCSI topology 500 in accordance with the present invention, one embodiment of which is employed on the base adapter 205. The embodiment in FIGS. 2A, 2B is implemented under the Ultra 3 SCSI protocols. However, as noted above there are a variety of SCSI protocols. Typically, when people refer to "SCSI" in a generic fashion, they are referring to SCSI-2, but this is not always the case. The tuned stub, SCSI topology 500 of FIG. 5 may be implemented using a variety of these SCSI standards.

The topology 500 includes a SCSI bus 510, a breakout node 515 on the SCSI bus 510; an external SCSI connector 520, an internal SCSI connector 525, a SCSI adapter 530, and a terminator 535. In an actual, physical embodiment, each of the external SCSI connector 520, internal SCSI connector 525, SCSI adapter 530, and terminator 535 could be either a pin of or a pad for a chip. The breakout node 515 could be a via in a printed circuit board ("PCB") and the SCSI bus 510 could be traces on the PCB (not shown). The external SCSI connector 520 is positioned on the SCSI bus 510 at a first point defined by a first propagation delay $t_{d1}$. The internal SCSI connector 525 is also positioned on the SCSI bus 510, but at a second point defined by a second propagation delay $t_{d2}$. The first and second propagation delays $t_{d1}$, $t_{d2}$ are substantially equal. The SCSI adapter 530 and the terminator 535 electrically tap the breakout node 515.

More technically, the signals traveling on the SCSI bus 510 would ordinarily be expected to travel at the speed of light, but for a number of factors well known in the art. For instance, a signal's propagation through the conductive material that comprises the SCSI bus 510 introduces delay. However, greater delay is introduced by, for example, the electrical loading introduced of SCSI devices (not shown) on the SCSI bus 510, the routing of wires and traces that comprise the SCSI bus 510, and the particular implementation of the connectors, e.g., the external connector 520 or the internal connector 525.

Note that the propagation delay may vary at different portions of the SCSI bus 510. In the context of the invention, the important consideration in determining the first and second points at which the external and internal connectors 520, 525 are located is the propagation delay from the breakout node 515. Thus, the distances $d_1$, $d_2$ at which the external and internal connectors 520, 525 are located is immaterial except to the extent they provide an upper boundary affecting the propagation delays $t_{d1}$, $t_{d2}$. Note that, in some embodiments, the SCSI bus 510 may have a constant propagation delay per unit length such that the distances $d_1$, $d_2$ may be equal because they produce equal delays $t_{d1}$, $t_{d2}$.

In one particular embodiment, the topology 500 is implemented in accordance with the Ultra 2 or Ultra 3 SCSI specification. Generally speaking, in this implementation, it is preferred that the distances $d_1$, $d_2$ be less than 3.5" and the delays $t_{d1}$, $t_{d2}$ should be less than 525 ps to inhibit significant signal degradation. It is also generally preferred for the same reason that: (1) the distance of the SCSI adapter 530 from the breakout node 515 should be less that 1.5" and the propagation delay less than 225 ps; and (2) the distance between the terminator 535 and the breakout node 515 should be less than 6.0" and the propagation delay less than 900 ps.

Note that the propagation delays $t_{d1}$, $t_{d2}$ are "substantially" equal. As will be appreciated by those in the art having the benefit of this disclosure, there are several limitations on the precision with which the propagation delays $t_{d1}$, $t_{d2}$ can be implemented. For instance, variations in bus device embodiments might introduce variation in electrical loading, which affects propagation delay. Similarly, design constraints might limit flexibility in bus layout so that a designer does not have the latitude to achieve precisely equal propagation delays. The propagation delays $t_{d1}$, $t_{d2}$ would ideally be precisely equal, because a difference will degrade performance proportionally to the amount of the difference. However, in various embodiments, some difference can be tolerated in light of variations introduced in the design, manufacturing, and assembly processes.

Returning to FIG. 2B, the traces 217 constitute, in the illustrated embodiment, a SCSI bus. The SCSI bus is a differential bus consisting of 27 differential pairs of signals, or 54 total signals. Note that not all details of the SCSI bus are shown, e.g., not all of the traces 217 of the SCSI bus are shown. Each trace 217 is interrupted by a via 218, which corresponds to the breakout node 515 in FIG. 5. The illustrated embodiment in FIG. 2B exemplifies several aspects that are implementation specific. Namely:

the external connector 220 in the illustrated embodiment is a stacked connector comprising two ports 220a, 220b connected to the two ports 225a, 225b, respectively, by the traces 217. However, the ports 220a, 220b need not necessarily be stacked in alternative embodiments.

the routing of the traces 217 are illustrative only. As those in the art having the benefit of this disclosure will appreciate, the routing of any individual trace will be implementation specific depending on well known factors. Any routing may be employed provided the resulting propagation delays are as is discussed above relative to FIG. 5.

the connectors 220, 225 may be affixed to the PCB 216 in any suitable manner known to the art.

the number of termination packages 250 will depend on their "type". Also as will be appreciated by those skilled in the art, termination packages, e.g., the termination packages 250, come in a variety of sizes, e.g., 9, 15, 30 line termination packages. The number of termination packages 250 will be determined by the size of the packages employed and the necessity to terminate the traces in the SCSI bus 210. Thus, the present invention admits wide variation within the parameters discussed above relative to FIG. 5.

Returning to FIG. 2, the Intelligent HBA 200 includes the daughtercard 210. The daughtercard 210 "translates" signals received from the base adapter 205 in accordance with a first protocol and translates them in accordance with a second protocol, if necessary, to communicate with external devices. The daughtercard 210 will be implementation specific, and the Intelligent HBA 200 is configurable in the sense that it can be configured by utilizing different implementations of the daughtercard 210 as is discussed further below. This aspect can be used to add upgradeability to a base RAID controller; upgrade from two-channel SCSI to four-channel SCSI; upgrade from two-channel SCSI to two-channel SCSI with Fibre channel; and/or one-channel and two-channel Fibre on a network interface card ("NIC"). Note that FIGS. 3A, 3B do not show all aspects of the daughtercard 210 so as not to obscure the invention.

Figure 3A:
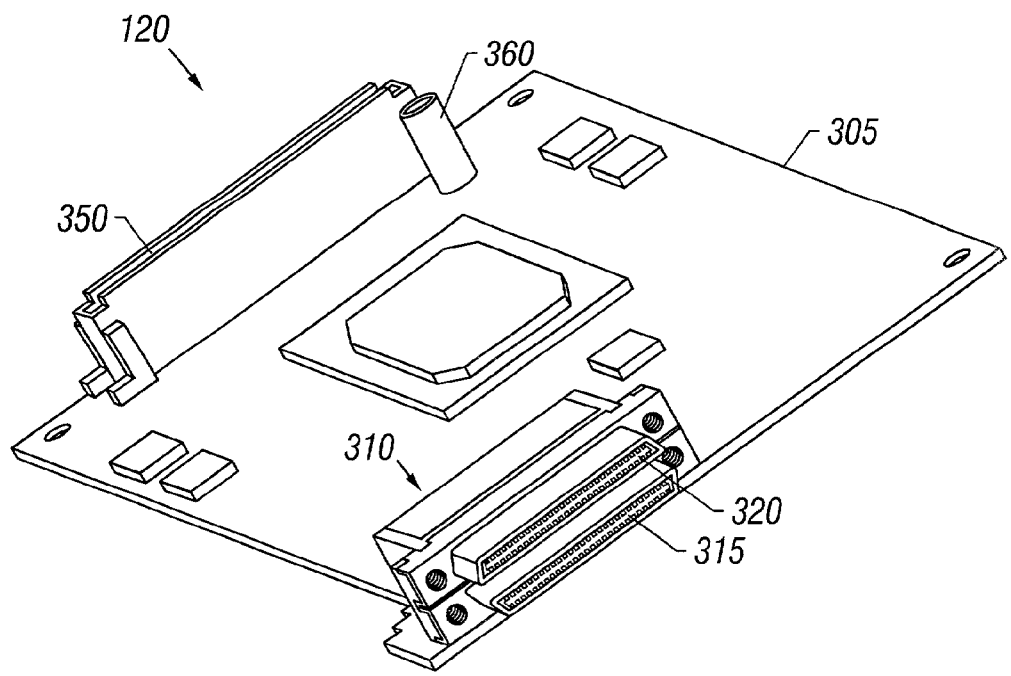
FIGS. 3A, 3B show the daughtercard of the intelligent host bus adapter of FIGS. 2A, 2B.
Figure 3B:
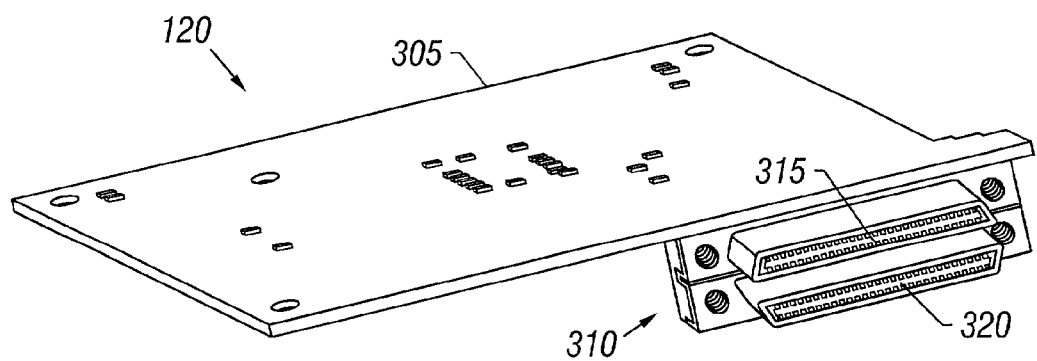
Figure 6A:
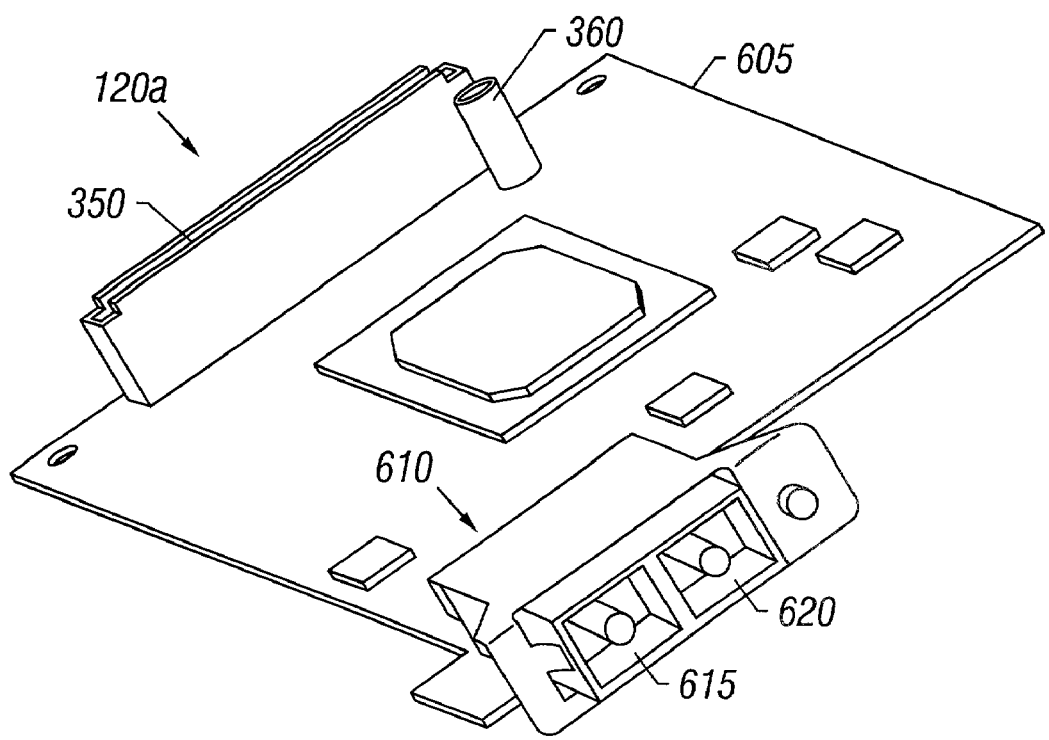
FIGS. 6A, 6B illustrate an embodiment of the daughtercard of FIGS. 1, 2A, and 2B alternative to that shown in FIGS. 3A, 3B.
Figure 6B:
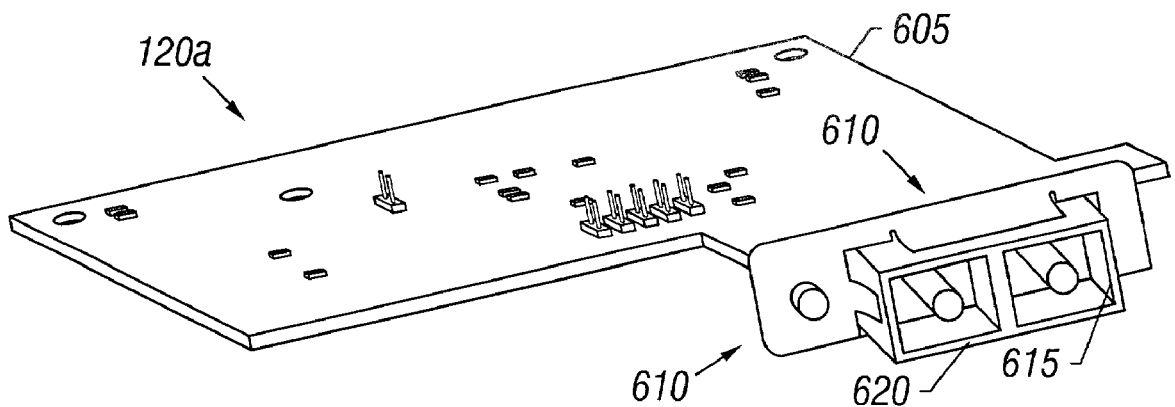

The configurability of the Intelligent HBA 200 can be illustrated by considering the implementation of FIGS. 3A, 3B. These figures illustrate, in a top view and a bottom view, respectively, but one embodiment 300 of the daughtercard 210. This particular embodiment 300 comprises a SCSI connector 310 over which the Intelligent HBA 200 can be interfaced to a network (not shown). The connector 310 includes a port 3 slot 315 and a port 4 slot 320. A very high density connector interface ("VHDCI") SCSI connector (not shown) may be connected thereto. FIGS. 6A, 6B illustrate in a top view and a bottom view, respectively, an alternative embodiment 600 of the daughtercard 210 with a Fibre channel connector 610 affixed to a PCB 605 over which the Intelligent HBA 200 may be interfaced with a network. The Fibre channel connector 610 includes a transmit port 615 and a receive port 620. A 1×9 Fibre channel connector (not shown) may be connected thereto. In both embodiments 300, 600, the network interfacing capabilities for the Intelligent HBA 200 to interface to a network are segregated from the base adapter 205 to the daughtercard 210.

Both the daughtercard 300 in FIGS. 3A, 3B and the daughtercard 600 in FIGS. 6A, 6B include a connector 350 by which they may be mounted to the base adapter 205 (shown best in FIG. 2B) and a standoff 360 into which a screw (not shown) may be screwed to help secure the daughtercard 300, 600 to the baseboard. Note that the connector 350, standoff 360, connector 310 (in FIGS. 3A, 3B), and connector 610 (in FIGS. 6A, 6B) may be fastened to the PCB 305 in any suitable manner known to the art. For instance, with respect to the connector 350, the slot 315, 320 are fastened to a bracket 352 by a pair of nuts 354 screwed onto a threaded posts (not shown) inserted into openings (also not shown) in the bracket 352. The bracket 352 is, in turn, affixed to the PCB 305 by fasteners (not shown). However, any suitable technique known to the art may alternatively be employed.

The Intelligent HBA 200 is configurable to provide either an otherwise conventional RAID controller functionality or a RAID controller permitting direct attached storage to be shared. The Intelligent HBA 200 is configurable by switching out various implementations of the daughtercard 210. This is done by segregating various "interfacing" capabilities off the base adapter 205 onto the daughtercard 210 so that different implementations of the daughtercard 210 can be used to configure the Intelligent HBA 200 for different uses. Thus, the daughtercard 210 can be used to "modify" a protocol in use on the Intelligent HBA 200.

Figure 7A:
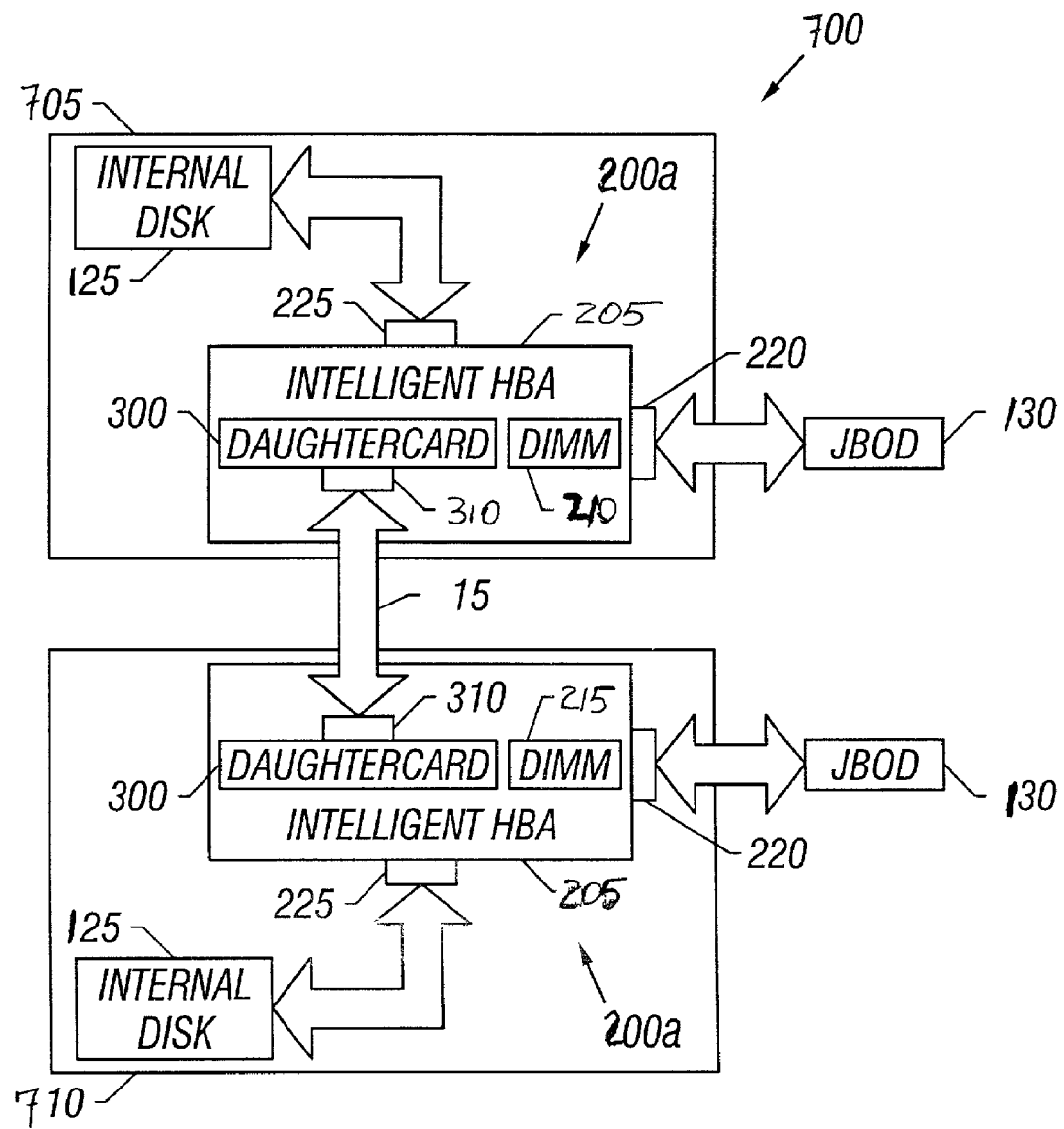
FIGS. 7A, 7B depict two computing systems employing alternative embodiments of the intelligent host bus adapter of FIG. 1 to illustrate its configurability.

For instance, FIG. 7A illustrates a computing system 700 in which the Intelligent HBA 200a implements the daughtercard 210 using the embodiment 300 of FIGS. 3A–3B. The Intelligent HBA 200a in FIG. 7A provides an otherwise conventional RAID functionality wherein the JBOD 120 and internal disk 125 provide local, direct attached memory. The servers 705, 710 communicate with each other over the SCSI bus 715, which includes the connectors 310 on the daughtercards 300. Note that there is no shared memory and the servers 705, 710 communicate directly with the direct attached memory (i.e., the internal disk 125, JBOD 130), which is local memory. The network interfacing capability necessary for the servers 705, 710 to communicate across the SCSI bus 715 is well known and commonly employed. In conventional practice, this network interface capability is implemented on the base adapter and of the HBA. However, in the embodiment illustrated in FIGS. 3A–3B and 7A, this capability is segregated onto the daughtercard 210, i.e., the embodiment 300.

Figure 7B:
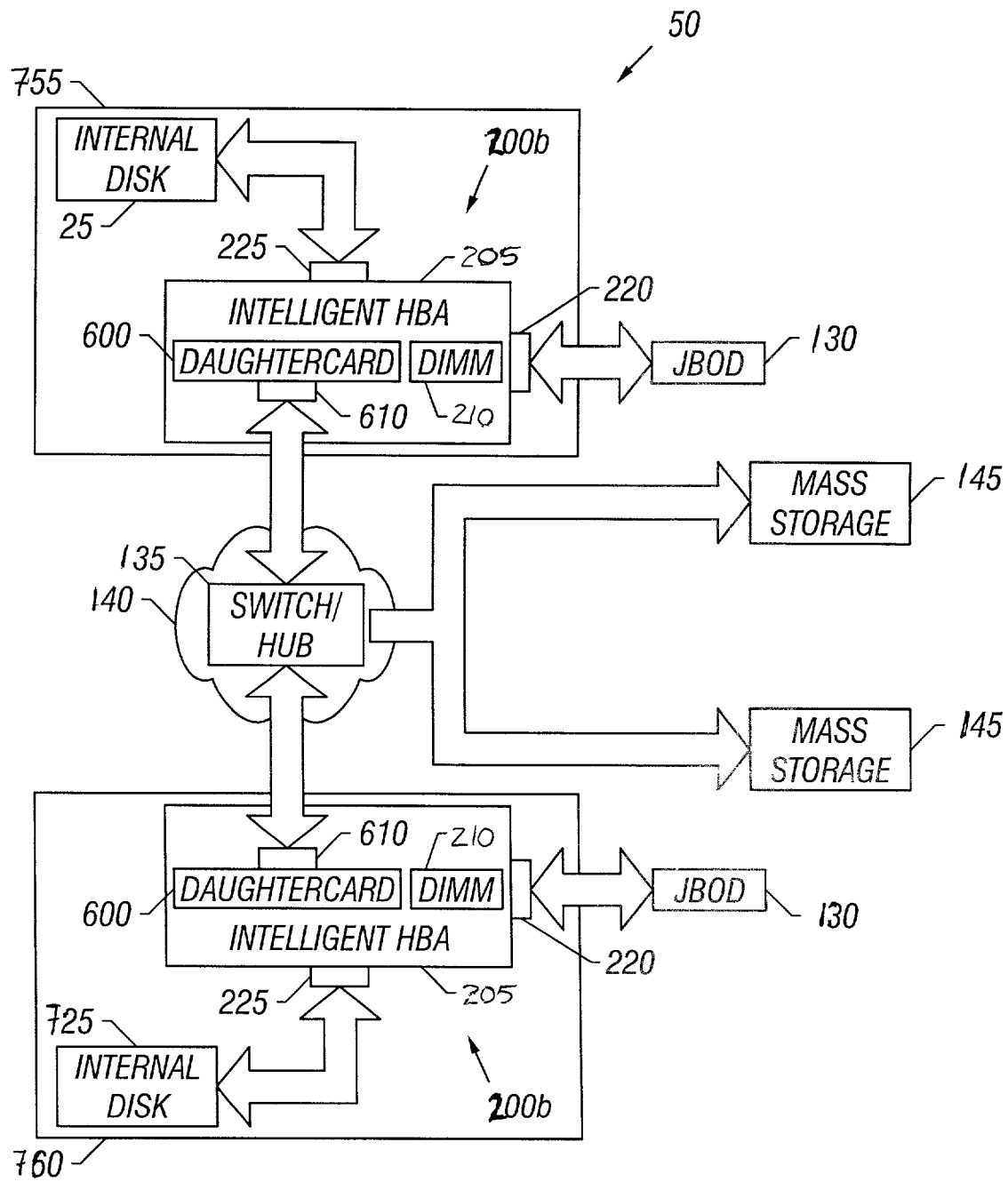

The Intelligent HBA 200b in FIG. 7B illustrates the daughtercard 210 using the embodiment 600 of FIGS. 6A–6B. The Intelligent HBA 200b receives Fibre signals employing SCSI semantics that can then be "translated" into SCSI signals for use on the base adapter 205. The network interfacing capability necessary for the servers 755, 760 to communicate across the Fibre fabric 140 is well known and commonly employed. In conventional practice, this network interface capability is implemented on the base adapter and of the HBA. However, in the embodiment illustrated in FIGS. 6A–6B and 7B, this capability is segregated onto the daughtercard 210, i.e., the embodiment 600. This has numerous advantages including the ability for processors to share direct attached memory and the ability to back up the direct attached memory remotely, e.g., to a tape backup (not shown) over the Fibre fabric 140.

Thus, segregating this "interfacing" capability normally found on the base adapter 205 onto the removable, replaceable daughtercard 210, the Intelligent HBA 200 provides numerous advantageous characteristics. This approach can also be used to add upgradeability to a base RAID controller; upgrade from two-channel SCSI to four-channel SCSI; upgrade from two-channel SCSI to two-channel SCSI with Fibre channel; and/or one-channel and two-channel Fibre on a network interface card ("NIC"). This ability to upgrade also has the salutary effect of lengthening the life of the Intelligent HBA 200 and reducing it's cost to upgrade as the technology evolves. This also means that the Intelligent HBA 200 is configurable in the field depending upon the particular computing system being implemented.

Figure 4A:
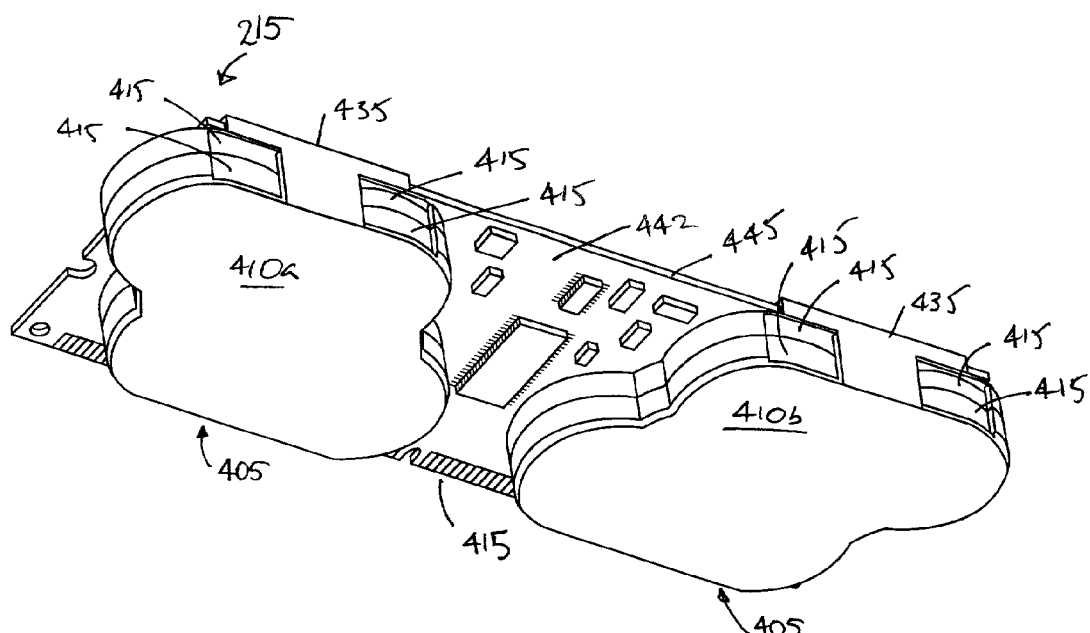
FIGS. 4A–4C illustrates a cache card of the intelligent host bus adapter of FIG. 2A, 2B with a battery backed cache of the implementation in FIGS. 2A, 2B.
Figure 4B:
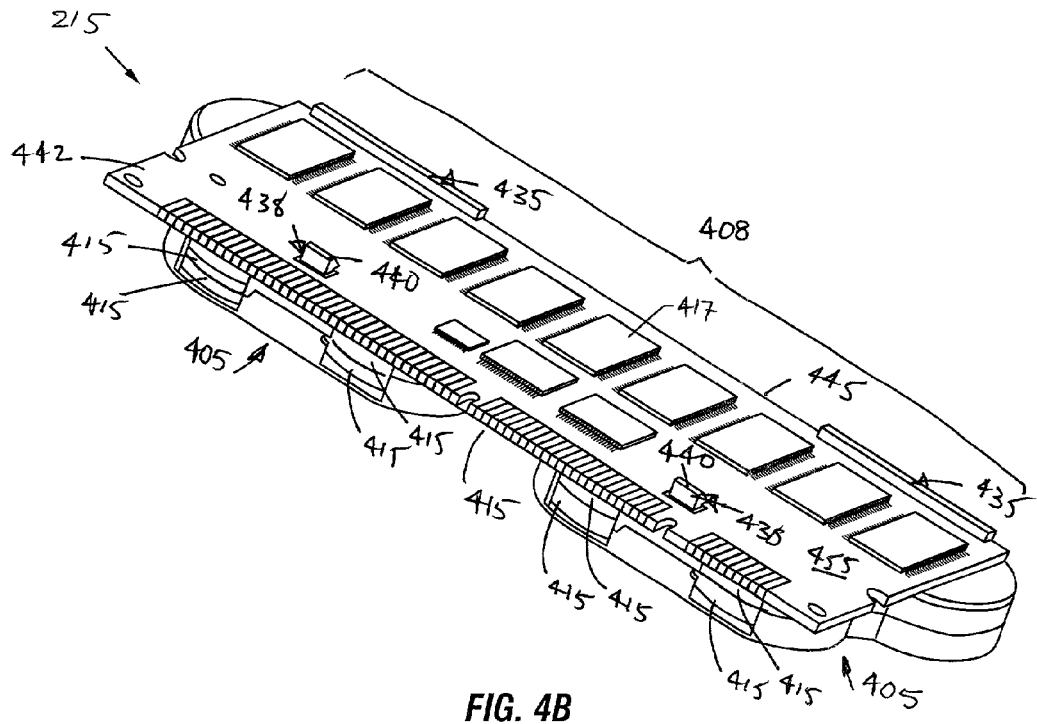
Figure 4C:
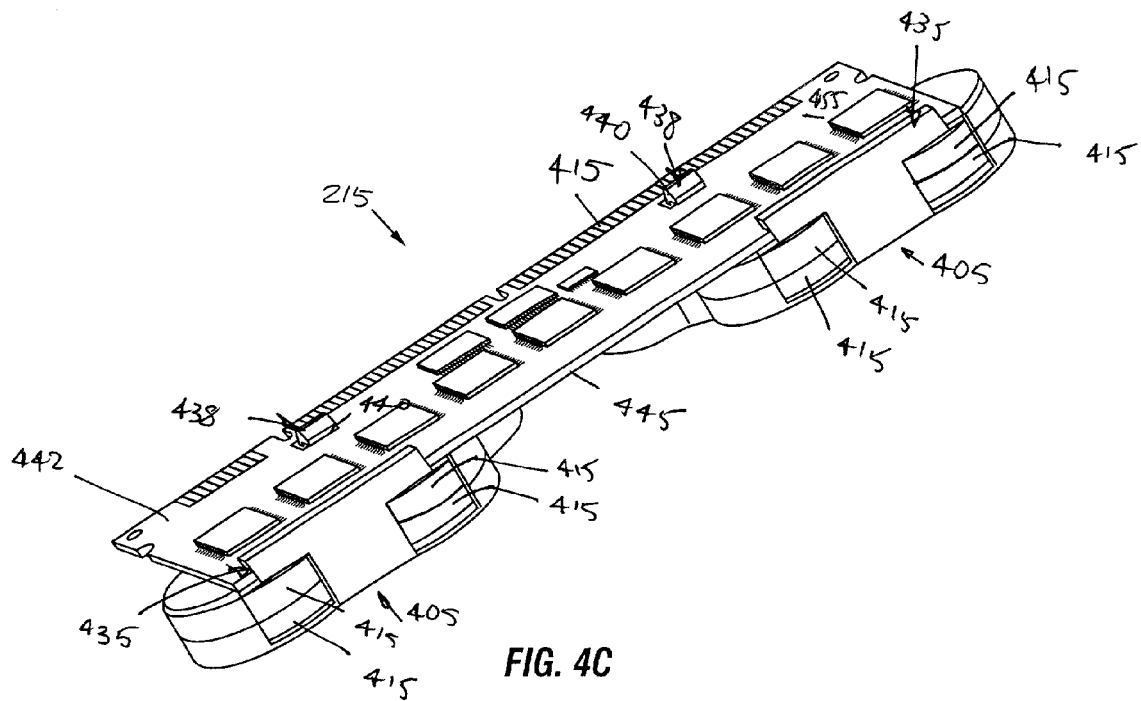

The cache card 215 of FIG. 2 is better illustrated in FIGS. 4A, 4B, 4C. The cache card 215 particularly includes, inter alia, in various aspects:
  a removable battery pack 405 for the cache card 215;
  a DIMM connector 415 accommodating sideband signals; and
  a decrementable fuel gauge, which is implemented in software as is disclosed more fully disclosed below.

The cache card 215 is, in the illustrated embodiment, a 100 MHz battery backed synchronous dynamic random access memory ("SDRAM") DIMM that adheres to the Intel PC100 version 1.2 registered DIMM specification. The cache card 215 can accept either 64, 128, or 256 Mb, 4 bank CL2 low power SDRAM memory chips. In the illustrated embodiment, the cache card 215 is a DIMM, but this is not necessary to the practice of the invention. The cache card 215 may be, in alternative embodiments, a single in-line memory module ("SIMM"), a RIMM, etc.

Figure 4D:
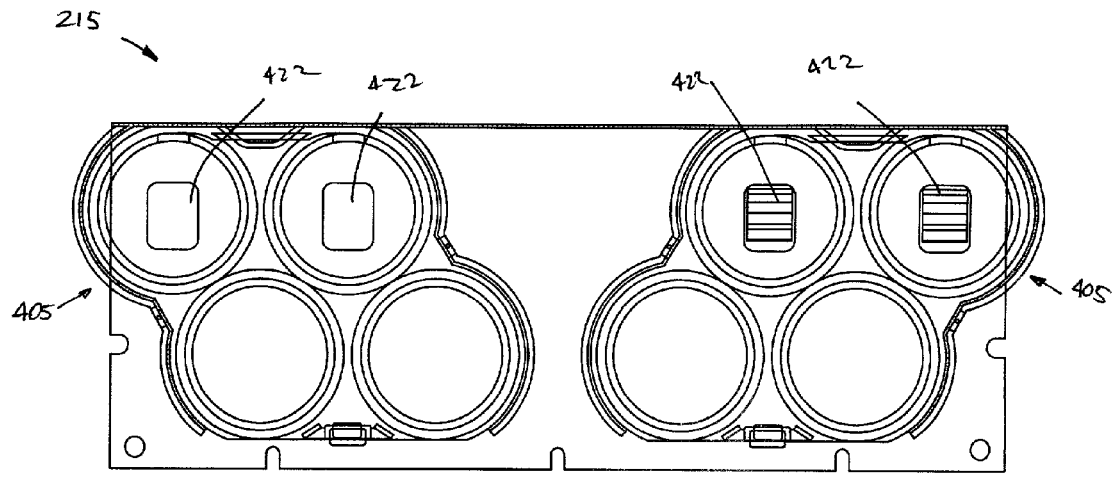

FIGS. 4A–4C provide elevational views of the cache card 215 from different viewpoints and FIG. 4D illustrated the cache card 215 in a partially sectioned, plan view. The cache card 215 includes two battery packs 410a, 410b mounted to a memory module 408. The memory module 408 is, in the illustrated embodiment, a dual in-line memory module ("DIMM") that functions as a cache. Thus, the memory module 408 comprises a cached backed by the batteries 415 of the battery packs 410a, 410b, i.e., a battery backed cache. The battery packs 410a, 410b and their alternative embodiments may be used not only with the memory module 408 of the illustrated embodiment, but also DIMMs as are known in the art. Indeed, the memory module 408 need not necessarily even be a DIMM, but may implement some other technology, e.g., a single in-line memory module ("SIMM").

The battery packs 410a, 410b house eight batteries 415 each. The batteries 415 power a cache comprising multiple memory devices 417, as best shown in FIG. 4B, implemented on the memory module 408. In the illustrated embodiment, the batteries 415 are Nickel Metal-Hydride ("NiMH") batteries, but other suitable battery types may be used. Note that the battery packs 410a, 410b are "left-handed" and "right-handed", i.e., not bilaterally symmetrical about the central axis 418 shown in FIG. 4F. Consequently, the battery packs 410a, 410b are not interchangeable. However, this is not necessary to the practice of the invention. Alternative embodiments may employ battery packs that are fully interchangeable with one another.

The number of batteries 415 and battery packs 410a, 410b will be implementation specific. Two battery packs 410a, 410b were chosen in the illustrated embodiment so that each memory module in the cache may be individually powered by a single pack 410a, 410b of batteries 415. In this particular implementation, the battery packs 410a, 410b are redundant, although this is not necessary to the practice of the invention. Thus, in the event one of the battery packs 410a, 410b fails, the other may support the entire load. If both battery packs 410a, 410b are operational, then they will share the load.

Figure 4E:
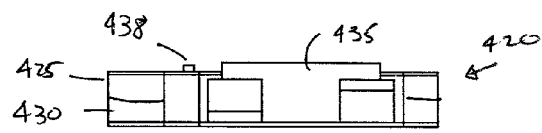
Figure 4H:
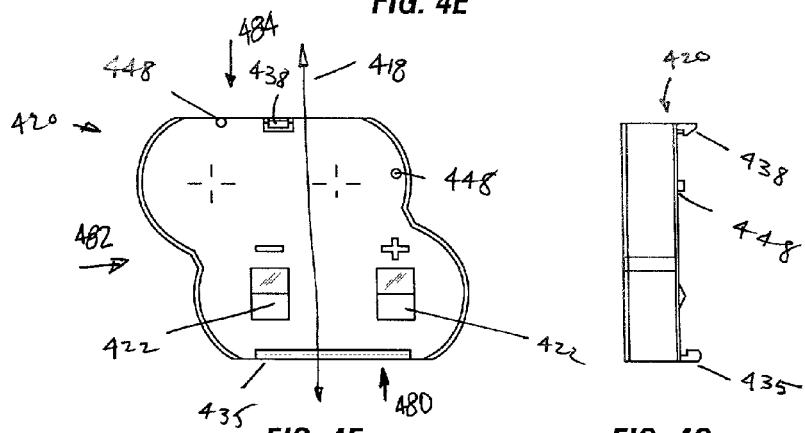
Figure 4H:
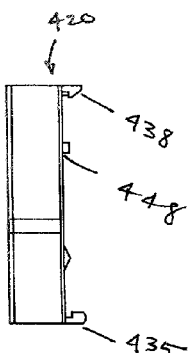
Figure 4H:
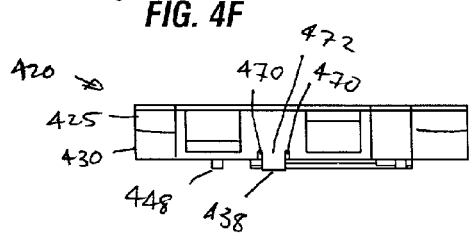

FIGS. 4E–4H better illustrate the construction of the battery pack 410a, which is the same as battery pack 410b except that one is right-handed where the other is left-handed. FIGS. 4E, 4G, and 4H are side, plan views of the battery pack 410a viewed from the direction indicated by the arrows 480, 482, 484 in FIG. 4F, which is a top, sectional view of the battery pack 410a. Note that the battery pack 410 is shown in the FIGS. 4E–4H without the batteries 415.

Referring now to FIGS. 4E–4H, the casing 420 comprises a first part 425 and a second part 430 that are, in the illustrated embodiment, ultrasonically welded together once the batteries 415 have been positioned inside. However, ultrasonic welding is not necessary to the practice of the invention and other techniques may be used to join the first and second parts 425, 430 of the casing 420. The positions of the batteries 415 is shown better in the plan, sectional view of FIG. 4D. Note the electrical contacts 422 for contacting the battery terminals to establish the power circuit. The casing 420 may be constructed of any suitable material known to the art, e.g., a non-conducting plastic of some kind.

The second part 430 includes a lip 435 and a flexible tab 438 terminating in a hook 440. The casing 420 is assembled with the PCB 442 by engaging the lip 435 with one edge 445 of the PCB 442 as shown in FIGS. 4A–4C. The PCB 442, in the illustrated embodiment, includes a slot 446 designed to engage with the lip 435, but this is not necessary to the practice of the invention. After the lip 435 engages the PCB 442, the casing 420 is rolled toward the PCB 442 until the flexible tab 438 "snaps" into a slot in the PCB 442. The location of the slot will be implementation specific. Generally speaking, it is preferred that the slot be as close to the edge 450 opposite the edge 445 as possible without sacrificing the structural integrity of the PCB 442. However, this is not necessary to the practice to the invention and the slot may be located elsewhere in alternative embodiments. Note that point of engagement between the battery pack 410a, 410b defines the path of the rolling movement. In the illustrated embodiment, the casing 420 includes a plurality of pegs 448 extending into corresponding blind bores in the PCB 442 to prevent planar movement of the battery packs 410a, 410b once they are assembled to the PCB 442.

When the flexible tab 438 is inserted into the slot, the hook 440 passes all the way through the PCB 442 and engages the surface 455 opposite the side 460 to which the battery pack 410a, 410b is mounted. The length of the flexible tab 438 should be long enough so that this engagement secures the battery pack 410a, 410b to the PCB 442 snugly in order to facilitate the electrical contact between the battery pack 410a, 410b and the PCB 442. Note that the assembly of the battery pack 410a, 410b to the PCB 442 establishes the electrical contact through which the batteries 415 power the DIMMs. To replace the batteries 415, the battery pack 410a, 410b can be disassembled from the PCB 442 by manually pushing the hook 440 back toward the edge 450 and pushed back through the slot.

Thus, the lip 435 and the flexible tab 438 comprise, by way of example and illustration, means for engaging and securing (through a spring force), respectively, the battery pack 410a, 410b to the PCB 442 of the cache card 215. However, the invention is not so limited. Alternative embodiments may employ alternative, equivalent structures performing this same function. Similarly, the pegs 448 comprise, again by way of example and illustration, but one means for preventing planar movement of the battery pack 410a, 410b relative to the PCB 442 when the battery pack 410a, 410b is secured to the PCB 442. Alternative embodiments may also employ alternative, equivalent structures performing this function. Note, however, that the structure of the lip 435, flexible tab 438, and pegs 448, and any equivalent structure that may be employed in alternative embodiments, is such that they permit the assembling of the battery pack 410a, 410b to the PCB 442 without the use of tools while rigidly securing the battery packs 410a, 410b to the PCB 442.

Referring now to FIG. 4H, a slot 470 is cut in the casing 420 on each side of and at the base 472 of the flexible tab 438. The slots 470 alleviate stresses acting on the flexible tab 438 at the base 472 as a result of the spring force inhering in the assembly/disassembly process when the hook 440. The slots 470 are not necessary to the practice of the invention, but embodiments omitting the slots 470 have a greater tendency for the flexible tab 438 to shear from the casing 420.

Thus, the casing 420 includes two retention features that enable the battery packs 410a, 410b to be assembled to a memory module without use of a tool. These two features specifically are the lip 435 that, during assembly, grabs the bottom of the memory module and the plastic hook 440 that flexes during the installation process and "snaps" through a hole in the DIMM memory module, grabbing the underside of the DIMM memory module. These two features ensure that the battery packs 410a, 410b remains secure during any transportation or shipping of the memory module.

The design of the cache card 215 allows it to not only be readily assembled with and removed from the daughtercard 210, but to do so without any tools. Thus, this aspect of the present invention allows new batteries to be replaced on the existing cache card at less than 3% of the cost of a new cache card. Still further, the battery backed DIMM can be replaced with an industry standard DIMM and the battery pack and cache card fit within the envelope specified by PCI specifications and passes the appropriate levels for shock and vibration testing.

The cache card 215 also includes a DIMM connector 415, including pins for transmitting sideband signals for the battery backed cache. The Intelligent HBA 200 of FIG. 2 is pinned out so that it can be accepted as an industry standard DIMM or replaced by an industry standard DIMM. A logic "1" on pin 61 indicates the cache card 215 is to operate as if with an industry standard DIMM. Table 1 contains the pin description for the connector 415 and Table 2 contains the pin list. The Intelligent HBA 200 can be used for 64 MB, 128 MB, or 256 MB. Unused address lines are "no connect" (or "NC") at the SDRAM chips. As is apparent from the pin description in Table 1, the DIMM connector redefines an N/C signal and one of the I2C addressing pins for use in a different function.

TABLE 1

DIMM Pin Description

| SIGNAL | TOTAL | DESCRIPTION |
|---|---|---|
| GND | 18 | Ground |
| VCC | 17 | 3.3 V System Power |
| DU | 3 | Don't Use |
| NC | 1 | Optional Battery Voltage for AUX. Power |
| VREF | 2 | Reserved for LVTTL DIMMS |
| DQ[0:63] | 64 | Data Bus |
| CB[0:15] | 16 | Check bits for ECC operation |
| A[0:13] | 14 | Address |
| BA[0:1] | 2 | Bank address for DIMM (cache card 215 uses 4 bank SDRAM) |

TABLE 1-continued

DIMM Pin Description

| SIGNAL | TOTAL | DESCRIPTION |
|---|---|---|
| S[0:3] | 4 | Chip select (S0 and S2 = 1 BANK / S1 andS3 = OPEN) |
| RAS_ | 1 | Row address strobe |
| CAS_ | 1 | Column address strobe |
| WE_ | 1 | Write enable |
| CK[0:3] | 4 | Clocks (CK0=100 MHz / CK1-3=OPEN) |
| CKE[0:1] | 2 | Clock enables (Held low during self refresh) |
| DQMB[0:7] | 8 | Byte mask (cache card 215 can only mask 8 bytes at a time) |
| SA[1:2] | 2 | NVRAM address |
| SCL | 1 | I2C clock (Gate with a CPLD when using 2 or more cache card 215s) |
| SDA | 1 | I2C data |
| REGE | 1 | Register enable (1=Registered Mode / 0=Buffered Mode) |
| PRESENT_/ NC | 1 | cache card 215 Present = 0 V / Commodity or Not present = pull-up |
| PWR_GOOD / NC | 1 | Power indicator for 3.3 V system voltage, Vtrip=2.9 V–2.95 V |
| NVRW_/ NC | 1 | NO VRAM read/write strobe |
| NVCS_/ SA0 | 1 | NOVRAM chip select / Commodity DIMM will have SA0=1 |
| BAT_PWR_EN / WP | 1 | NOVRAM data-bit -- Enables Battery Power During Panic |

TABLE 2

DIMM Pin List

| PIN # | SIGNAL | PIN # | SIGNAL | PIN # | SIGNAL | PIN # | SIGNAL |
|---|---|---|---|---|---|---|---|
| 1 | GND | 43 | GND | 85 | GND | 127 | GND |
| 2 | DQ0 | 44 | DU | 86 | DQ32 | 128 | CKE0 |
| 3 | DQ1 | 45 | S2_ | 87 | DQ33 | 129 | S3_ |
| 4 | DQ2 | 46 | DQMB2 | 88 | DQ34 | 130 | DQMB6 |
| 5 | DQ3 | 47 | DQMB3 | 89 | DQ35 | 131 | DQMB7 |
| 6 | VCC | 48 | DU | 90 | VCC | 132 | A13 |
| 7 | DQ4 | 49 | VCC | 91 | DQ36 | 133 | VCC |
| 8 | DQ5 | 50 | CB10 | 92 | DQ37 | 134 | CB14 |
| 9 | DQ6 | 51 | CB11 | 93 | DQ38 | 135 | CB15 |
| 10 | DQ7 | 52 | CB2 | 94 | DQ39 | 136 | CB6 |
| 11 | DQ8 | 53 | CB3 | 95 | DQ40 | 137 | CB7 |
| 12 | GND | 54 | GND | 96 | GND | 138 | GND |
| 13 | DQ9 | 55 | DQ16 | 97 | DQ41 | 139 | DQ48 |
| 14 | DQ10 | 56 | DQ17 | 98 | DQ42 | 140 | DQ49 |
| 15 | DQ11 | 57 | DQ18 | 99 | DQ43 | 141 | DQ50 |
| 16 | DQ12 | 58 | DQ19 | 100 | DQ44 | 142 | DQ51 |
| 17 | DQ13 | 59 | VCC | 101 | DQ45 | 143 | VCC |
| 18 | VCC | 60 | DQ20 | 102 | VCC | 144 | DQ52 |
| 19 | DQ14 | 61 | PRESENT_/NC | 103 | DQ46 | 145 | NC |
| 20 | DQ15 | 62 | VREF/NC | 104 | DQ47 | 146 | VREF/NC |
| 21 | CB0 | 63 | CKE1 | 105 | CB4 | 147 | REGE |
| 22 | CB1 | 64 | GND | 106 | CB5 | 148 | GND |
| 23 | GND | 65 | DQ21 | 107 | GND | 149 | DQ53 |
| 24 | CB8 | 66 | DQ22 | 108 | CB12 | 150 | DQ54 |
| 25 | CB9 | 67 | DQ23 | 109 | CB13 | 151 | DQ55 |
| 26 | VCC | 68 | GND | 110 | VCC | 152 | GND |
| 27 | WE_ | 69 | DQ24 | 111 | CAS_ | 153 | DQ56 |
| 28 | DQMB0 | 70 | DQ25 | 112 | DQMB4 | 154 | DQ57 |
| 29 | DQMB1 | 71 | DQ26 | 113 | DQMB5 | 155 | DQ58 |
| 30 | S0_ | 72 | DQ27 | 114 | S1_ | 156 | DQ59 |

TABLE 2-continued

DIMM Pin List

| PIN # | SIGNAL | PIN # | SIGNAL | PIN # | SIGNAL | PIN # | SIGNAL |
|---|---|---|---|---|---|---|---|
| 31 | DU | 73 | VCC | 115 | RAS_ | 157 | VCC |
| 32 | GND | 74 | DQ28 | 116 | GND | 158 | DQ60 |
| 33 | A0 | 75 | DQ29 | 117 | A1 | 159 | DQ61 |
| 34 | A2 | 76 | DQ30 | 118 | A3 | 160 | DQ62 |
| 35 | A4 | 77 | DQ31 | 119 | A5 | 161 | DQ63 |
| 36 | A6 | 78 | GND | 120 | A7 | 162 | GND |
| 37 | A8 | 79 | CK2 | 121 | A9 | 163 | CK3 |
| 38 | A10/AP | 80 | NVRW_/NC | 122 | BA0 | 164 | PWR_GOOD/NC |
| 39 | BA1 | 81 | NVLATCH/WP | 123 | A11 | 165 | NVCS_/SA0 |
| 40 | VCC | 82 | SDA | 124 | VCC | 166 | SA1 |
| 41 | VCC | 83 | SCL | 125 | CK1 | 167 | SA2 |
| 42 | CK0 | 84 | VCC | 126 | A12 | 168 | VCC |

Conventional DIMM connectors built in accordance with industry standard specifications do not accommodate sideband signals regarding battery status or control. DIMM connectors accommodating such sideband signals employ custom pinouts, which then are incompatible with industry standard specifications. The present DIMM connector overcomes this conundrum by redefining pins that ordinarily are not connected or used for some purpose not presently germane to a different function accommodating the sideband signals) regarding battery status or control. Thus, the present DIMM connector can accommodate such sideband signals using an pinout compatible with industry standards. In the illustrated embodiment, four pins have been reassigned functions from a "no connect" status or other use—pin 61 (PRESENT_/NC), pin 80 (NVRW_/NC), pin 81 (NV-LATCH/WP), pin 164 (PWR_GOOD/NC), and pin 165 (NVCS_/SA0). Thus, in the illustrated embodiment, the sideband signals are indicative of indicate battery status, battery life, or battery control.

The PRESENT_signal is communicated on pin 61, which is a "no connect" in the industry standard pinout. The PRESENT_signal, is used to indicate that the cache card 215 is being used with a battery backed memory module, e.g., the cache card 215, in an Intelligent HBA 200 instead of in, e.g., a conventional RAID controller. To this end, the base adapter 205 includes a special pin (not shown) that, when the cache card 215 is plugged into the DIMM connector 415 grounds the PRESENT_signal which is high otherwise. That is, the PRESENT_signal is high unless the cache card 215 is used in an Intelligent HBA 200. Thus the PRESENT_signal on the pin 61 enables some functions of the illustrated embodiment not useful in conventional memory subsystems, such as a server. The PRESENT_signal can consequently be omitted from some alternative embodiments.

The non-volatile random access memory ("NVRAM") signals NVRW_, NVCS_, and NVLATCH convey selected information about the NVRAM, i.e., the cache. The NVRW_, NVCS_, and NVLATCH signals are communicated on pins 80, 165, 81, respectively, which are a no connect ("NC"), communicate a serial address bit ("SA0"), and communicate write protect ("WP") signal, respectively, in an industry standard pinout. More particularly:

NVRW_ is driven by the intelligent host bus adapter and received by the battery back cache to indicate the direction of the NVLATCH signal. When NVRW_ is high, the intelligent host bus adapter is performing a read operation. When NVRW_ is low, the intelligent host bus adapter is performing a write operation.

NVCS_ is driven by the intelligent host bus adapter and received by the battery back cache to indicate to the NOVRAM if it should receive new data during a write operation or drive the NVLATCH data line during a read operation.

NVLATCH is a single bit bidirectional data line used to store or read from a nonvolatile bit in the NOVRAM. A high value written to NVLATCH forces the battery backed cache 430 to enter back-up mode in the event of power loss. A high value read from NVLATCH indicates that data was intended to be stored in the battery backed cache prior to power down.

Note that the "NV" family of signals may be used without the PRESENT_signal in some alternative embodiments as was discussed above.

The power good signal PWR_GOOD is communicated on the pin 164, which is a no connect in an industry standard DIMM connector. This signal is driven by the battery backed cache 430 and received by the base adapter 205 to indicate when the critical voltage level of the $V_{CC}$ power rail has been crossed. The power good signal will drop low immediately when the $V_{CC}$ rail falls below 2.95 V to offer an early warning to the memory controller that the power rail is dropping. The memory controller will use this signal to stop memory activity and place the SDRAM of the cache 430 into self refresh mode. The power good signal will rise high after about 200 mS after the $V_{CC}$ rail increases above 2.95V to allow circuits depending on the VCC power rail to stabilize before exiting the reset state.

Thus, the cache card 215 includes a modified DIMM connector pin-out to support sideband signals for a battery backed cache. Such a custom DIMM pin out allows the battery-backed cache to be used in an industry standard DIMM socket. It also allows industry standard DIMM to be used in a battery-backed cache socket. Still further, users will have a wider variety of cache modules to select for use.

The cache card 215 also includes a variety of features leading to improved power management. The Intelligent HBA 200 includes on the cache card 215 a micro-controller 850. In the illustrated embodiment, the micro-controller is an 8-bit micro-controller commercially available from Microchip Technology Incorporated, USA under the designation PIC12C67X, but any suitable micro-controller known to the art may be used. The micro-controller 850 is used to implement a battery fuel gauge, primarily in software, but which also includes a charging circuit for charging at least one battery and a decrementor circuit for counting the amount of time system power is removed from the battery.

The cache card 215 of the Intelligent HBA 200 in the illustrated embodiment utilizes 3.0–3.6V from the system. It internally generates 8V, 5V, and 3V_REF for its embedded circuitry. During normal operation the batteries 415 will fast charge for 1 minute during each hour for conditioning. Posted-write caching will only be enabled when both battery packs 410a, 410b are good. As a result, both battery packs 410a, 410b should be functional at the start of a power failure. Tables 3–4 provide additional information regarding battery back-up life and battery shelf life, respectively.

TABLE 3

Battery Back-up Life

| TOTAL BACKUP LIFE | 64 Mbyte | 128 Mbyte | 256 Mbyte |
| --- | --- | --- | --- |
| Memory Voltage (V) | 3.05 | 3.05 | 3.05 V |
| Memory Current (mA) | 4.80 | 8.30 | 10.30 mA |
| Reg Efficiency (%) | 92% | 92% | 92% |
| Diode Efficiency (%) | 95% | 95% | 95% |
| Avg. Battery Voltage (V) | 4.90 | 4.90 | 4.90 V |
| Battery Current (mA) | 3.44 | 5.65 | 6.99 mA |
| Bat. Capacity (from Varta) (mA-H) | 360.00 | 360.00 | 360.00 mA-H |
| Run Time (Days 2 bat) | 8.72 | 5.31 | 4.29 Days |
| Capacity for 4 days (2 pack/NR) | 46% | 75% | 93% |

TABLE 4

Battery Shelf Life

| TOTAL SHELF LIFE | | | | |
| --- | --- | --- | --- | --- |
| Self Discharge 20C | 10 month | 6 month | 3 months | 2 months |
| Lost capacity (mAHr) | 65 | 50 | 43 | 36 |
| #Hours (Hrs) | 7200 | 4320 | 2160 | 1440 |
| Average self discharge (uA) | 9 | 12 | 20 | 25 |

TABLE 4-continued

Battery Shelf Life

| Average Current Lost | 64 Mbyte | 128 Mbyte | 256 Mbyte |
| --- | --- | --- | --- |
| Vlbi Resistor Leakage | 2.0 | 2.0 | 2.0 uA |
| 1474 Vin - Shutdown Mode | 6.0 | 6.0 | 6.0 uA |
| Diode Ireverse | 4.0 | 4.0 | 4.0 uA |
| Micro-Controller | 25.0 | 25.0 | 25.0 uA |
| MAX1615 | 7.2 | 7.2 | 7.2 uA |
| Op-AMP Leakage Pack0 | 10.0 | 10.0 | 10.0 uA |
| Op-AMP Leakage Pack1 | 10.0 | 10.0 | 10.0 uA |
| MAX712 BATT+Pack0 | 5.0 | 5.0 | 5.0 uA |
| MAX712 BATT+Pack1 | 5.0 | 5.0 | 5.0 uA |
| Self Discharge of Pack0 | 9.0 | 9.0 | 9.0 uA |
| Self Discharge of Pack1 | 9.0 | 9.0 | 9.0 uA |
| TOTAL: | 92.20 | 92.20 | 92.20 uA |
| Months to 4day min (2pack/NR): | 5.86 | 2.71 | 0.76 months |
| Months to 0% Capacity (2pack/NR): | 10.85 | 10.85 | 10.85 months |

In particular, the Intelligent HBA 200 includes a sophisticated power management scheme. The micro-controller 850 detects battery status from two onboard A/D converters (not shown) with 8-bit accuracy. The micro-controller 850 forces a fast charge for one minute during each hour to condition the battery packs 410a, 410b and tracks the battery capacity. The micro-controller 850 also controls battery power enable, and reports battery information across an Inter-IC ("I2C") bus. The I2C bus is a well-known bus design typically used to connect integrated circuits ("ICs"). An I2C is a multi-master bus, i.e., multiple chips can be connected to the same bus and each one can act as a master by initiating a data transfer.

The micro-controller/I2C memory map is set forth in Table 5.

TABLE 5

Micro-controller 450 I2C Memory Map

| Address | Register Name | | Description |
| --- | --- | --- | --- |
| 0 | micro-controller ID | | Always reads the I2C address for verification |
| 1 | Revision | | micro-controller revision 04h |
| 2 | Charge Status | 0 | Short 0 (At least 1 of the 4 cells are shorted) |
| | | 1 | Open 0 (Pack Not installed or open circuit found) |
| | | 2 | Good 0 (Capacity and health is ok for 4day backup) |
| | | 3 | Charging0 (Fast Charging pack 0) |
| | | 4 | Short 1 (At least 1 of the 4 cells are shorted) |
| | | 5 | Open 1 (Pack Not installed or open circuit found) |
| | | 6 | Good 1 (Capacity and health is ok for 4 day backup) |
| | | 7 | Charging1 (Fast Charging pack 1) |
| 3 | CAPACITY0 | | Capacity left in pack0 in hex (0%–100%) |
| 4 | CAPACITY1 | | Capacity left in pack1 in hex (0%–100%) |
| 5 | RD_BATT0 | | Battery voltage is re-sampled every 2 seconds |
| 6 | RD_BATT1 | | Battery voltage is re-sampled every 2 seconds |
| 7 | RW_MODE | 0 | RSVD |
| | | 1 | DIAGS_MODE -- 0=Disable / 1=Enable |
| | | 2 | STRAP_MODE -- 1=64MB / 0=128MB |
| | | 3 | BATT_EN - Detected state of BATT_EN pin |
| | | 4 | LED_EN -- Set to 1 to update registers 1A-1C |
| 8 | FIRST_BATT0 | | First voltage read from PACK0 after power-up |
| 9 | FIRST_BATT1 | | First voltage read from PACK1 after power-up |
| A | FGLHR_CNT | | 0–256 hour counter used for backup mode fuel gauge |
| C | FG2DAY_CNT | | 0–512 day counter used for discharge mode fuel gauge |
| B | FGHR_CNT | | 0–24 hour counter used for discharge mode fuel gauge |
| D | FG16SEC_CNT | | 0–225 16 sec unit counter for discharge mode fuel gauge |
| E | PRIMARY_CNT | | Debug -- Counts down every 59.965 s |

TABLE 5-continued

Micro-controller 450 I2C Memory Map

| Address | Register Name | | Description |
|---|---|---|---|
| F | SECONDARY_CNT | | Debug -- Counts down every 59.965 s |
| 10 | MINUTE_CNT | | Debug -- Counts down every 59.965 s |
| 11–17 | RESERVED | | These are variables used to perform math functions |
| 18 | I2CFLG | 0 | I2C_SA -- 1=next byte is sub-address |
| 19 | I2CREG | | Copy of SSPSTAT |
| 1A | LEDON_TIMER | | Count value for OPEN status ON duration |
| 1B | LEDOFF_TIMER | | Count value for OPEN status OFF duration |
| 1C | LED_REG | | Bit [7:4] = LEDOFF_TIMER init, [3:0] =LEDON_TIMER init. |
| 1D | SCRATCH | | This registers can be used as NVRAM |
| 1E–1F | RESERVED | | These registers are used internally |

The health bits in the charge status register (discussed further below) are used to indicate why the packs are not good. If an open condition occurred, an amber status LED (not shown) for that particular pack will blink and the associated bit in the status register will be set. If a short condition occurred, the amber status LED for that particular pack will remain solid. If either a short or open condition exists, the capacity register and good bit in the status register (discussed further below) will be cleared to 0.

The micro-controller 850 voltage threshold determination in the illustrated embodiment will depend on a number of factors. More particularly:

Under-voltage shutdown=3.8V: During back-up mode the voltage memory ("VMEM") switching regulator is enabled discharging a total of 5–6 mA of current from both batteries 415 simultaneously. The regulator is disabled when the battery pack voltage hits 3.8V which is less than 2% capacity. At this time any data backed up in the cache 430 on the base adapter 110 will be lost. This is a safety precaution to prevent cell reversal. The regulator does not turn back-on until the battery pack voltage rises above 4.4V to prevent oscillation.

Open Pack Voltage $\geq 6.6$ V: If this threshold was set too low a battery pack that was fast charging could be wrongfully accused of being open (fast charge voltage=6.5 V). If this threshold was set too high max charger voltage (7.38 V) could not help an open pack reach trip point. A 120 ms delay was added to the micro-controller 850 before sampling this voltage to allow the step-up charging regulator and fast charge IC's to ramp-up.

Shorted Pack Voltage $\leq 4.7$ V: If this threshold was set too low, a 1 out of 4 cell short within a pack will not be detected (3×1.5 V=4.5 V). If this threshold was set too high a 0% pack (4.8 V) or normal pack may be marked as damaged. A ten-second delay was added to the micro-controller 850 before sampling this voltage to allow the packs that tripped the under-voltage shutdown to charge above the shorted pack voltage.

Other embodiments might employ alternative factors or approaches.

The cache card 215, in the illustrated embodiment, also includes a "fuel gauge" that extrapolates lost battery capacity based on elapsed time during the loss of system power. More particularly, the cache card 215 tracks the elapsed time during the loss of system power to the battery 415. As will be appreciated by those skilled in the art having the benefit of this disclosure, system power can be used to charge and maintain the batteries 415 at full capacity. However, the loss of system power will result in the loss of capacity as the batteries 415 will discharge through a number of physical phenomena such as leakage and self-discharge. The rates of discharge from these phenomena can be estimated. The cache card 215 then extrapolates from the elapsed time the loss in capacity during the elapsed time using such estimates. In the illustrated embodiment, estimates are formulated on a worst-case scenario for a variable load. The fuel gauge will therefore indicate that the batteries 415 have at least the indicated capacity and the batteries 415 will therefore typically have a higher than indicated capacity. However, this is not necessary to the practice of this aspect of the invention. For instance, the estimate may be formulated assuming a fixed load.

Figure 8:
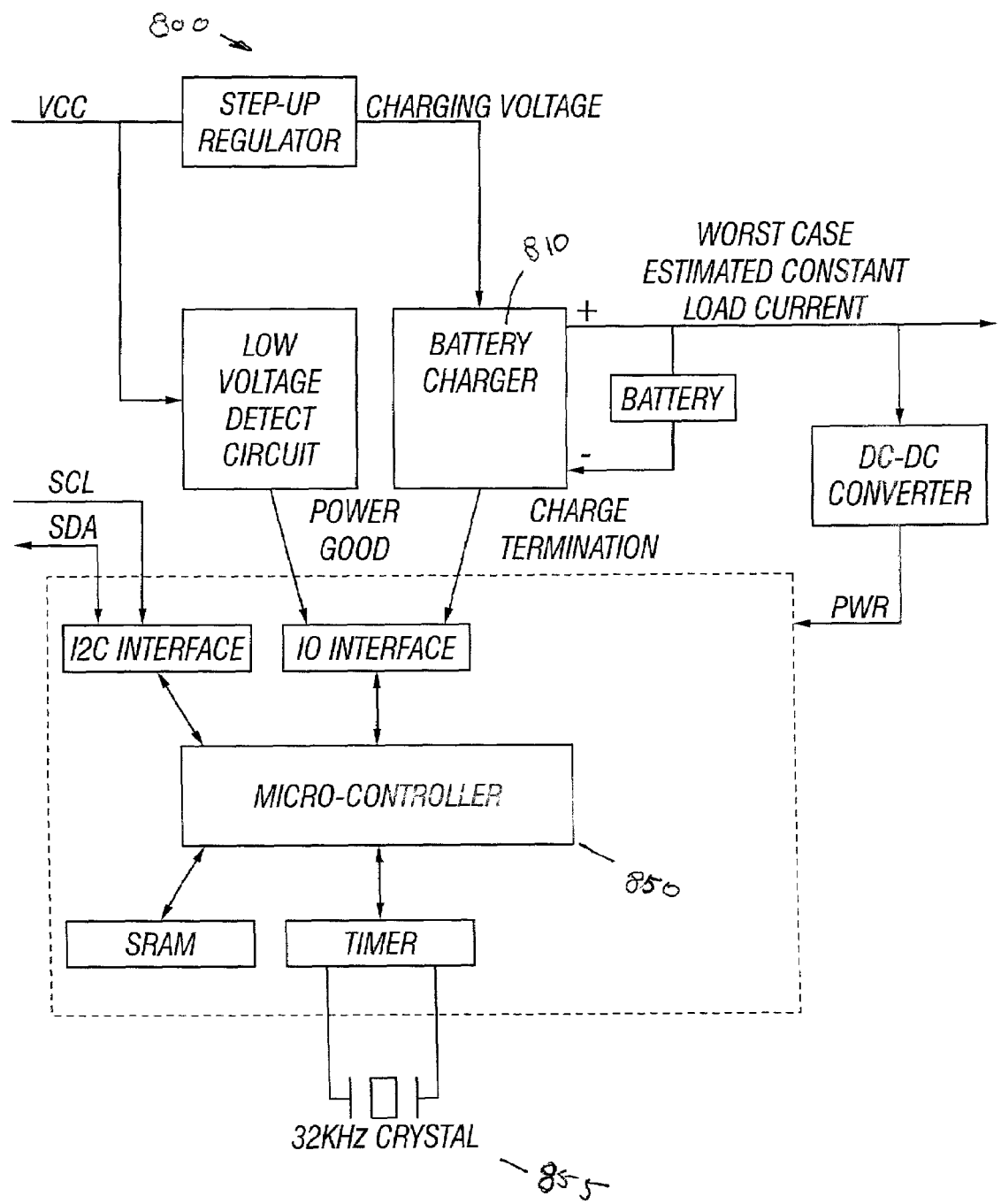
FIG. 8 illustrates a fuel gauge for the cache card.

More particularly, this fuel gauge comprises a resettable decrementor based upon the amount of time in backup or non-backup (i.e., loss of battery capacity due to leakage and self-discharge). When the batteries 415 are first attached to the circuit 800, shown in FIG. 8, the capacity in the batteries 415 is not known. A charging circuit 810 will then begin to charge the batteries 415 until some type of charge termination is met. In one particular embodiment, the charging circuit 810 is implemented with a MAX712 integrated circuit available from Maxim Integrated Products, Inc. The type of charge termination may be any suitable sort known to the art. At this time, the batteries 415 will be marked as having full capacity, which will sharply reset the fuel gauge decrementor from 0% capacity to 100% capacity. After which the charging circuit 810 will maintain 100% charge on the battery 415 until system power is removed from the charging circuit 810.

When the system power is removed, the batteries 415 will begin to drain. The fuel gauge decrementor circuit (discussed further below) will operate at a low power state while it counts the amount of time that the system power is removed. In the illustrated embodiment, this is performed by a power reset chip (not shown) and the low power micro-controller 850, which operates from a 32 KHz clock 855. In one particular implementation, the power reset chip is a X24C105 integrated circuit commercially available from Xicor Corporation. The fuel gauge decrementor circuit will continue to track the amount of time in backup until system power is returned to the charging circuit 810.

The fuel gauge decrementor circuit will, in the illustrated embodiment, know if the batteries 415 were enabled to sustain a load during this time. If the load on the batteries 415 is not engaged, the fuel gauge decrementor circuit will equate the final count value to the lost capacity based upon the amount of power consumed to sustain the counter circuit, plus any power loss due to extra components and self discharge within the battery pack. If the load on the batteries 415 is engaged (such as the cache being placed in a low power state to back up data), the fuel gauge decrementor circuit will equate the final count value to the lost capacity based upon the amount of power consumed to sustain the fuel gauge decrementor circuit, plus any power loss due to extra components, self discharge by the battery 415, and the maximum amount of current expected to be consumed by the load.

The fuel gauge decrementor circuit at this point should contain a new capacity indicating that the battery is within the range 0%–100% charge. Since the system power is enabled, the batteries 415 will begin to charge. At this time, in the illustrated embodiment, the fuel gauge decrementor circuit does not increment, although it may do so in alternative embodiments. When the charging circuit 810 reaches charge termination, a signal will indicate to the decrementor circuit that the batteries 415 are at 100% capacity at which time the fuel gauge decrementor circuit will reset the capacity. If the system power is lost prior to the charging circuit reaching charge termination, the fuel gauge decrementor circuit will decrement the existing capacity without resetting the capacity.

The "fuel gauge" is implemented partially in software executed by the micro-controller 850 and 4 hardware, timer registers (not shown) in the micro-controller 850. As noted above, when system power is lost, the micro-controller 850 shuts down all peripherals (not shown) to operate at a low current. The timer registers in the micro-controller 850 are initialized when power is lost. These registers are used to track the amount of time the server has been powered down. An external 32 KHz crystal 855 with a 16-bit timer will overflow at a 16 second rate. After the overflow occurs, the micro-controller 850 will decrement the necessary timers and execute the sleep instruction. When server power returns, the timer registers are used to calculate the amount of capacity lost. The capacity lost will be calculated based upon whether the memory was in backup mode or self discharge mode and whether the DIMM capacity is 32/64 MB or 128 MB.

In the illustrated embodiment, the following registers are used:

CAPACITY0 and CAPACITY1—This register indicates the amount of capacity left in a battery pack in percent. This register is set to 100% when the external fast charge IC begins to trickle charge. This register is cleared to 0% when the ADC module (not shown) detects an OPEN or SHORT on the battery pack 410a, 410b. This register is reduced when system power returns and the fuel gauge software determines the percentage of capacity loss. A separate software technique is used depending on whether the cache card 215 was in backup mode with 32/64 MB of cache, backup mode with 128 MB of cache, or self discharge mode.

FGLHR_CNT—The FGLHR_CNT register counts down from 255 to 0 and decrements each hour during power loss. When power is returned, this register is complemented to indicate the number of hours the cache card 215 was running from battery power. This register is used to calculate the capacity loss when backup mode is enabled.

FG2DAY_CNT—The FG2DAY_CNT register counts down from 255 to 0 and decrements every 2 days during power loss. When power is returned, this register is complemented to indicate the number of two-days the cache module was running from battery power. This register is used to calculate the capacity loss when self discharge mode is enabled.

FGHR_CNT—The FGHR_CNT register counts down from 48 to 0 and decrements each hour during a power loss. When power is returned, this register is complemented to indicate the number of hours to add to the number of days the cache card 215 running from battery power.

FG16SEC_CNT—The FG16SEC_CNT register counts down from 225 to 0 and decrements every 16 seconds during a power loss. When power is returned, this register is complemented to indicate the number of 16 seconds to add to the number of hours the cache module was running from battery power.

This approach has numerous advantages over conventional approaches to the problem of monitoring battery capacity. First, it will work on any battery chemistry. It also saves board space without the need for series resistors and ADC circuits. It is easy to implement when using loads that have a fixed current draw, such as memory placed in a low power state. And, it involves low cost, since it only requires a power reset chip and a low power micro-controller.

This concludes the detailed description. Note that some portions of the present invention might be implemented in software, and hence described in terms of a software implemented process involving symbolic representations of operations on data bits within a computer memory. These descriptions and representations are the means used by those in the art to most effectively convey the substance of their work to others skilled in the art. The process and operation require physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantifies. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

The particular embodiments disclosed above are illustrative only, as the invention may be modified and practiced in different but equivalent manners apparent to those skilled in the art having the benefit of the teachings herein. For instance, the cache card 215 might be employed in a laptop computer rather than a RAID controller. This would provide the advantage of being able to port the state of one laptop computer to a second laptop computer provided both employed a sleep state. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A DIMM connector, including:
   a first plurality of pins connected to circuitry on a DIMM; and
   a second plurality of pins having a dedicated connection to a battery status signal or a battery-backed cache control signal.

2. The DIMM connector of claim 1, wherein the battery status signal indicates battery life.

3. The DIMM connector of claim 1, wherein the second plurality of pins include at least one of:
   a pin that communicates a signal indicating the presence of a battery backed memory module;
   a pin that communicates a signal indicative of battery life;
   a pin that communicates a signal indicative of non-volatile memory control; and
   a pin that communicates a signal indicative of a battery power mode.

4. A cache card, including:
   a DIMM connector comprising a first plurality of pins connected to circuitry on the cache card and a second plurality of pins dedicated for use to transmit a battery status or a battery-backed cache control signal.

5. The cache card of claim 4, wherein the battery status signals indicates battery life.

6. The cache card of claim 4, wherein the second plurality of pins includes at least one of:
   a pin that communicates a signal indicating the presence of a battery backed memory module;
   a pin that communicates a signal indicative of battery life;
   a pin that communicates a signal indicative of non-volatile memory control; and
   a pin that communicates a signal indicative of non-volatile memory control.

7. The DIMM connector of claim 1, wherein the second plurality of pins include:
   a pin that communicates a signal indicating the presence of a battery backed memory module;
   a pin that communicates a signal indicative of battery life;
   a pin that communicates a signal indicative of non-volatile memory control; and
   a pin that communicates a signal indicative of a battery power mode.

8. The DIMM connector of claim 1 wherein at least one of the second plurality of pins is used by a host system to which the DIMM connector mates to determine whether other of said second plurality of pins are to be used to transmit a battery status or a battery-backed cache control signal, or whether such other signals are unconnected or used for a purpose other than the transmission of a battery status or a battery-backed cache control signal.

9. The cache card of claim 4, wherein the second plurality of pins include:
   a pin that communicates a signal indicating the presence of a battery backed memory module;
   a pin that communicates a signal indicative of battery life;
   a pin that communicates a signal indicative of non-volatile memory control; and
   a pin that communicates a signal indicative of a battery power mode.

10. The cache card of claim 4 wherein at least one of the second plurality of pins is used by a host system to which the cache card mates to determine whether other of said second plurality of pins are to be used to transmit a battery status or a battery-backed cache control signal, or whether such other signals are unconnected or used for a purpose other than the transmission of a battery status or a battery-backed cache control signal.

* * * * *

UNITED STATES PATENT AND TRADEMARK OFFICE
CERTIFICATE OF CORRECTION

PATENT NO. : 7,007,184 B2
APPLICATION NO. : 09/948890
DATED : February 28, 2006
INVENTOR(S) : Michael L. Sabotta et al.

It is certified that error appears in the above-identified patent and that said Letters Patent is hereby corrected as shown below:

On the Title page, in field (54), in column 1, in "Title", line 1, delete "ACCOMODATING" and insert -- ACCOMMODATING --, therefor.

In column 1, line 1, delete "ACCOMODATING" and insert -- ACCOMMODATING --, therefor.

Signed and Sealed this

Twenty-eighth Day of April, 2009

JOHN DOLL
*Acting Director of the United States Patent and Trademark Office*